(12) United States Patent
Chang

(10) Patent No.: US 8,624,619 B2
(45) Date of Patent: Jan. 7, 2014

(54) SEMICONDUCTOR DEVICE AND METHOD OF PERFORMING ELECTRICAL TEST ON SAME

(75) Inventor: Jin-Man Chang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 681 days.

(21) Appl. No.: 12/817,518

(22) Filed: Jun. 17, 2010

(65) Prior Publication Data

US 2011/0001507 A1 Jan. 6, 2011

(30) Foreign Application Priority Data

Jul. 1, 2009 (KR) .................. 10-2009-0059699

(51) Int. Cl.
  *G01R 31/26* (2006.01)
(52) U.S. Cl.
  USPC .................................... 324/762.01
(58) Field of Classification Search
  USPC ............... 324/762.01–762.1, 750.01–750.3, 324/755.01–755.11; 257/48; 438/14–18
  See application file for complete search history.

(56) References Cited

U.S. PATENT DOCUMENTS

| 5,357,192 | A | * | 10/1994 | Van Zee et al. | 324/754.03 |
| 5,506,499 | A | * | 4/1996 | Puar | 324/754.03 |
| 6,320,398 | B1 | * | 11/2001 | Ito et al. | 324/756.02 |

FOREIGN PATENT DOCUMENTS

JP  2008071999 A  3/2008

* cited by examiner

*Primary Examiner* — Tung X Nguyen
(74) *Attorney, Agent, or Firm* — Volentine & Whitt, PLLC

(57) ABSTRACT

A semiconductor device comprises a substrate, a plurality of bonding pads formed on the substrate, a reference pad comprising a plurality of sensing lines located in a reference pad area of the substrate, and a plurality of detection wirings electrically connected to the respective sensing lines. The bonding pads are configured to make contact with a plurality of probe pins of a test apparatus to receive electrical test signals for an electrical test of the semiconductor device. The reference pad is configured to make contact with a reference pin of the test apparatus, and the reference pad area has substantially the same shape and size as the bonding pads such that positions in the reference pad area correspond one-to-one with positions in each of the bonding pads.

20 Claims, 7 Drawing Sheets

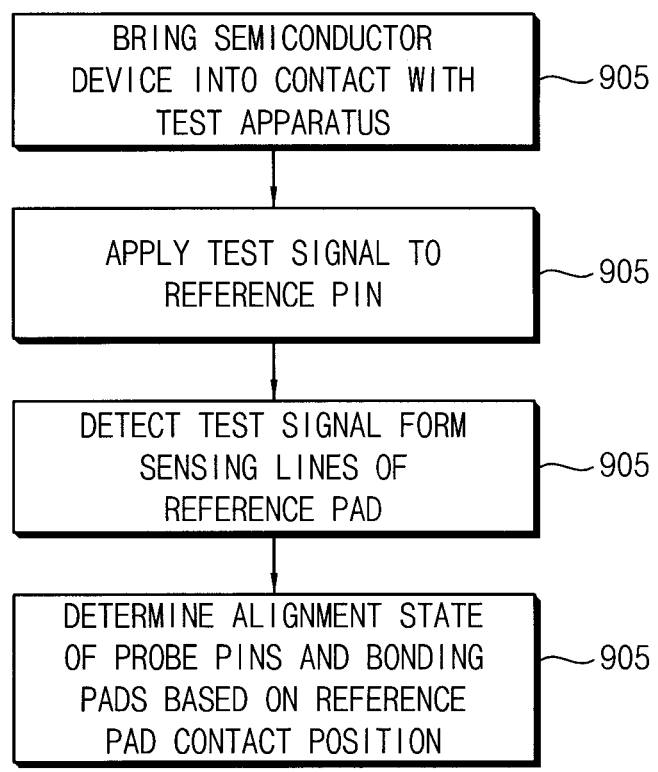

SEMICONDUCTOR DEVICE AND METHOD OF PERFORMING ELECTRICAL TEST ON SAME

CROSS-REFERENCE TO RELATED APPLICATIONS

This application claims priority under 35 U.S.C. §119 to Korean Patent Application No. 10-2009-0059699 filed on Jul. 1, 2009, the disclosure of which is hereby incorporated by reference in its entirety.

BACKGROUND

Embodiments of the inventive concept relate generally to semiconductor devices and methods of testing the semiconductor devices. More particularly, embodiments of the inventive concept relate to methods for establishing alignment between bonding pads of semiconductor devices and probe pins on a probe card used to test the semiconductor devices.

Following fabrication, semiconductor devices are tested for defects and sorted according to whether or not any defects are detected. The processes used to test and sort the devices are referred to as electric die sorting (EDS) processes.

In conventional EDS processes, probe pins of a test apparatus such as a probe card are brought into contact with a plurality of bonding pads on a substrate such as a silicon wafer. With the probe pins in contact with the bonding pads, test signals are applied to the bonding pads to test the electrical properties of electrical elements formed on the substrate, such as microprocessor elements or memory elements.

In addition to supplying the test signals, the test apparatus also receives signals output through the bonding pads in response to the test signals. The received signals are analyzed to determine whether elements formed on the substrate contain any defects.

The accuracy of the EDS processes depends on maintaining proper electrical connections between the probe pins and the bonding pads. To ensure proper electrical connections, the probe pins should be precisely aligned with the bonding pads. Unfortunately, however, many conventional test systems lack the precision needed to reliably align the probe pins and bonding pads of modern semiconductor devices.

SUMMARY

Embodiments of the inventive concept provide semiconductor devices comprising a reference pad that can be brought into contact with a reference pin to assist the alignment of bonding pads and probe pins. Embodiments of the inventive concept also provide methods for performing electrical test on the semiconductor devices using the bonding pads and probe pins.

According to one embodiment of the inventive concept, a semiconductor device comprises a substrate, a plurality of bonding pads formed on the substrate, a reference pad comprising a plurality of sensing lines located in a reference pad area of the substrate, and a plurality of detection wirings electrically connected to the respective sensing lines. The bonding pads are configured to make contact with a plurality of probe pins of a test apparatus to receive electrical test signals for an electrical test of the semiconductor device. The reference pad is configured to make contact with a reference pin of the test apparatus, and the reference pad area has substantially the same shape and size as the bonding pads such that positions in the reference pad area correspond one-to-one with positions in each of the bonding pads.

In certain embodiments, the reference pad area is divided into a plurality of blocks each corresponding to an edge of the reference pad area, and wherein a subset of the sensing lines is arranged in each of the blocks in parallel with the corresponding edge.

In certain embodiments, the plurality of sensing lines is formed of metal.

In certain embodiments, the parallel sensing lines in each block are separated from each other by a gap distance that is smaller than a diameter of the reference pin.

In certain embodiments, the reference pad area has a rectangular shape.

In certain embodiments, the reference pad area is divided into four triangular blocks each delimited by a pair of diagonal lines extending from a central point of the reference pad area to respective corners of the corresponding edge.

In certain embodiments, sensing lines adjacent to the edges of the reference pad area are divided into piece lines and sensing lines adjacent to the central point of the reference pad area are undivided.

In certain embodiments, the reference pad area is divided into a first block at a center portion of the reference pad area and a second block surrounding the first block.

In certain embodiments, the second block comprises four regions in which sensing lines are arranged in parallel with a corresponding edge of the reference pad area.

In certain embodiments, the first block corresponds to an aligned position of the reference position, and the second block corresponds to a misaligned position of the reference pin.

In certain embodiments, the reference pad further comprises an insulation pattern or a conductive pattern covering the first portion of the reference pad area.

In certain embodiments, the semiconductor device further comprises a dynamic random access memory or a flash memory device formed on the substrate and electrically connected to the bonding pads.

According to another embodiment of the inventive concept, a method of performing an electrical test on a semiconductor device is provided. The semiconductor device comprises a plurality of bonding pads and a reference pad formed on a substrate, the reference pad comprising a plurality of sensing lines and having the same shape and size as the bonding pads. The method comprises bringing the semiconductor device into contact with a test apparatus comprising a plurality of probe pins and a reference pin, such that the probe pins make contact with the respective bonding pads and the reference pin makes contact with the reference pad. The method further comprises applying a test signal to the reference pin, detecting the test signal from a portion of the sensing lines making contact with the reference pin to determine a reference contact position between the reference pin and the reference pad, and determining an alignment state of the probe pins and the bonding pads based on the reference contact position.

In certain embodiments, the method further comprises shifting the reference pin to a central portion of the reference pad to shift the probe pins to respective central portions of the bonding pads.

In certain embodiments, determining the alignment state of the probe pins and the bonding pads based on the reference contact position comprises determining whether the reference contact position is in a first block spanning a central portion of the reference pad, or in a second block surrounding the first block, and upon determining that the reference contact position is in the second block, determining the alignment state to be misaligned.

In certain embodiments, the method further comprises applying test signals to the semiconductor memory device through the probe pins and the bond pads to perform an electric die sorting process.

In certain embodiments, the semiconductor memory device comprises a flash memory or a dynamic random access memory formed on the substrate.

According to still another embodiment of the inventive concept, a semiconductor device comprises a substrate having a central portion, a perimeter, and a peripheral portion bordering the perimeter, a plurality of bonding pads formed on the substrate in the peripheral portion, and a reference pad formed in the peripheral portion. The reference pad comprises a plurality of sensing lines each arranged in parallel with a nearest edge of the substrate and configured to receive a test signal to detect a location of a reference pin in a test operation of the semiconductor device.

In certain embodiments, the semiconductor device further comprises a plurality of detection wirings embedded in the substrate and connected to the respective sensing lines to transmit the test signal.

In certain embodiments, each of the sensing lines is separated from neighboring sensing lines by a distance smaller than a diameter of the reference pin.

BRIEF DESCRIPTION OF THE DRAWINGS

Embodiments of the inventive concept will be more clearly understood from the following detailed description taken in conjunction with the accompanying drawings. In the drawings, like reference numbers denote like features. In addition, the sizes and relative sizes of layers and regions may be exaggerated for clarity.

FIG. 9 is a flowchart illustrating a method of performing an electrical test in a semiconductor device such as those illustrated in FIGS. 1-8.

DETAILED DESCRIPTION OF THE EMBODIMENTS

Figure 1:
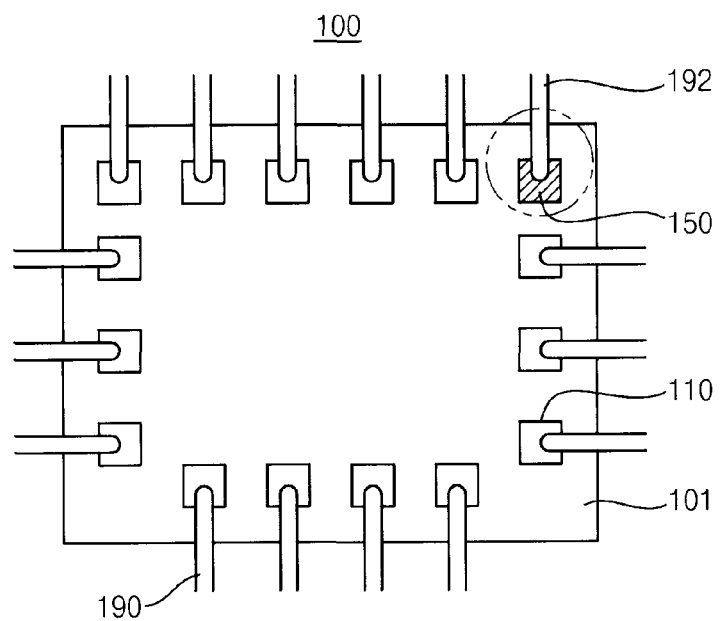
FIG. 1 is a plan view illustrating a semiconductor device in contact with a plurality of probe pins according to an embodiment of the inventive concept.

Various example embodiments will be described more fully hereinafter with reference to the accompanying drawings, in which some example embodiments are shown. The inventive concept may, however, be embodied in many different forms and should not be construed as limited to the example embodiments set forth herein. Rather, these example embodiments are provided so that this disclosure will be thorough and complete, and will fully convey the scope of the inventive concept to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2A:
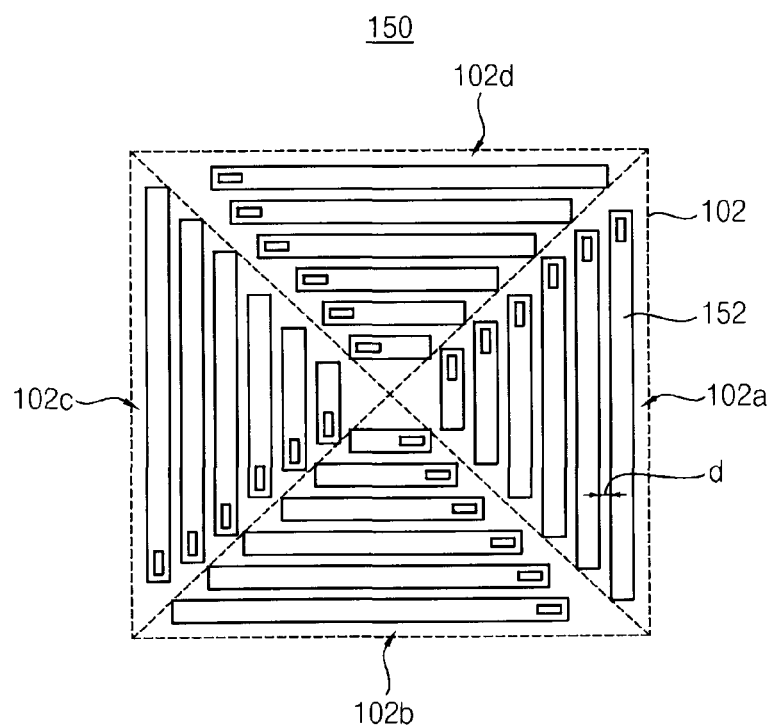
FIG. 2A is a plan view illustrating an embodiment of a reference pad in the semiconductor device of FIG. 1.
Figure 2B:
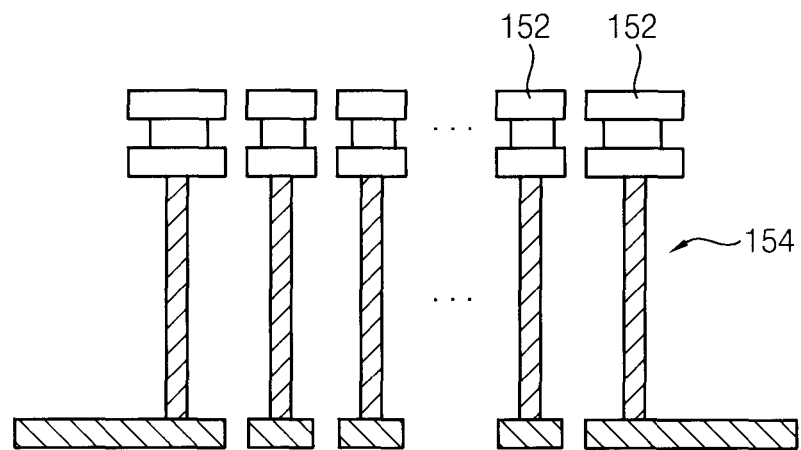
FIG. 2B is a cross-sectional view of the reference pad of FIG. 2A.
Figure 3:
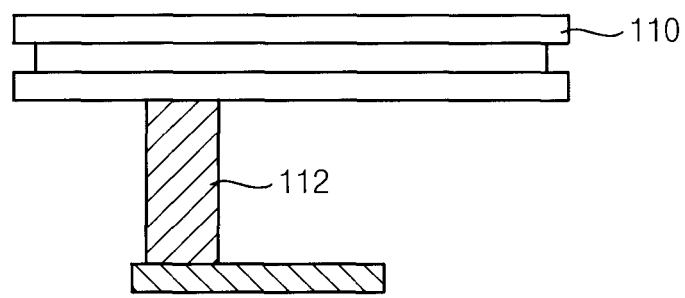
FIG. 3 is a cross-sectional view illustrating a bonding pad of the semiconductor device of FIG. 1.

FIG. 1 is a plan view illustrating a semiconductor device 100 in contact with a plurality of probe pins 190 according to an embodiment of the inventive concept. The probe pins are used to perform an electrical test on the semiconductor device. FIG. 2A is a plan view illustrating an embodiment of a reference pad 150 in semiconductor device 100. FIG. 2B is a cross-sectional view of reference pad 150. FIG. 3 is a cross-sectional view illustrating a bonding pad 110 of semiconductor device 100.

Referring to FIGS. 1 through 3, semiconductor device 100 comprises a plurality of bonding pads 110 in contact with an external test apparatus and at least one reference pad 150 for aligning the external test apparatus with bonding pads 110.

Semiconductor device 100 is formed on a substrate 101 that can be populated with a variety of conductive structures and electronic circuits connected to the conductive structures. For example, in some embodiments, substrate 101 comprises a semiconductor wafer and semiconductor device 100 is formed from one or more of a plurality of memory devices arranged on the wafer, such as a dynamic random access memory (DRAM) device and a flash memory device. Each memory device typically comprises a plurality of micro transistor structures and various electronic circuits for operating the transistor structures. The micro transistor structures are typically formed in a cell region of substrate 101 and the electrical circuits are typically formed in a peripheral region of the substrate 101.

The memory devices are typically separated into distinct units and manufactured into semiconductor packages through subsequent packaging processes. Before the packaging processes, the semiconductor devices undergo electrical tests such as an electrical die sorting (EDS) process. In the electrical tests, bonding pads on the semiconductor devices are connected to probe pins on a probing device. The probing device then applies electrical signals to the devices to test their functions.

In the embodiment of FIG. 1, bonding pads 110 and reference pad 150 are arranged around outer portions of semiconductor device 100 such that a central portion of semiconductor device 100 is enclosed by an array of bonding pads 110 and reference pad 150. In the embodiment of FIG. 1, one reference pad 150 is positioned among multiple bonding pads 110 and each of the pads is shaped as a rectangle.

Bonding pads 110 each comprise a conductive material having low electrical resistance and allowing semiconductor device 100 to make contact with external devices without damaging to the transistor structures and the electronic circuits. Bonding pads 110 are spaced apart from the transistor structures and the electronic circuits by a distance and typically each comprise a signal wiring 112 connected to the transistor structures and the electronic circuits. Signal wiring 112 prevents direct contact between bonding pads 110 and the transistor structures and the electronic circuits, as shown in FIG. 3.

Reference pad 150 is positioned adjacent to bonding pad 110 in a configuration where an upper surface of reference pad 150 is coplanar with upper surfaces of bonding pads 110. In the example of FIG. 2, reference pad 150 comprises a plurality of signal lines 152 making contact with a reference pin 192 of the probe card and detection wirings 154 for detecting a reference signal from signal lines 152.

As indicated by the dotted line in FIG. 2A, reference pad 150 is positioned in a reference pad area 102 of substrate 101. Reference pad area 102 is formed with the same-sized perimeter as bonding pads 110, and bonding pads 110 are substantially aligned with reference pad area 102. Due to its positioning relative to bonding pads 110, reference pad 150 can be used to determine the positions of probe pins 110 on bonding pads 110. Moreover, by using a common coordinate system for reference pad area 102 and each of bonding pads 110, positions in reference pad area 102 and corresponding positions on bonding pads 110 can be designated with the same coordinate value. For instance, a center position of bonding pads 110 and reference pad area 102 can be assigned coordinates (0,0), and outer extreme portions of bonding pads 110 and reference pad area 102 having dimensions A×B can be assigned coordinates (A,0) and (0,B) along the respective x and y axes.

Probe pins 190 and reference pin 192 are controlled simultaneously by the probe card in order to detect the position of probe pins 190 on bonding pads 110 (hereinafter, a "second contact position") based on the position of reference pin 192 on reference pad 150 (hereinafter, "first contact position").

Reference pad area 102 is separated into a number of blocks 102a through 102d each comprising a plurality of sensing lines 152 of reference pad 150. Sensing lines 152 each comprise a conductive material. Typically, sensing lines 152 are formed of substantially the same material as bonding pads 110. In addition, upper surfaces of sensing lines 152 are coplanar with upper surfaces of bonding pads 110, and thus the first and second contact positions are located substantially in the same plane. Sensing lines 152 are separated from each other by an insulation layer interposed between neighboring sensing lines 152.

Where the upper surfaces of sensing lines 152 are not coplanar with the upper surfaces of bonding pads 110, the reference contact position of reference pin 192 can be different from the bonding contact position of probe pins 190. In such a case, the bonding contact position of probe pins 190 are misaligned with the reference contact position of reference pin 192 and thus it becomes difficult to properly control the position of probe pins 190 based on the position of reference pin 192. However, since sensing lines 152 are coplanar with bonding pads 110 and typically comprise the same material as bonding pads 110, the bonding contact position of probe pins 190 can be sufficiently synchronized with the reference contact position of reference pin 192 and thus probe pin 190 and bonding pads 110 can be accurately aligned with each other in accordance with the alignment of reference pad 150 and reference pin 192.

In some embodiments, a single reference pad 150 is sufficient for determining the bonding contact position between probe pins 190 and bonding pads 110. In some embodiments, additional reference pads can be used.

In FIG. 2A, first through fourth blocks 102a through 102d in reference pad area 102 are shaped as triangles each comprising a pair of diagonal lines extending from a central point to each corner point of the rectangular reference pad area 102 and an edge line of reference pad area 102. A central sensing line adjacent to the central point of reference pad area 102 is shorter than a lateral sensing line adjacent to the edge line of reference pad area 102. Sensing lines 152 in each block are arranged in parallel with the edge line of reference pad area 102.

Adjacent sensing lines 152 are separated from each other by a gap distance "d". Gap distance "d" of sensing lines 152 is typically smaller than a diameter of reference pin 192. Thus, where the electrical test process is performed on the semiconductor device, reference pin 192 makes electrical contact with at least one of sensing lines 152 of reference pad 150 and thus the reference contact position between reference pin 192 and reference pad 150 can be readily determined by detecting which of sensing lines 152 makes contact with reference pin 192. The bonding contact position of bonding pads 110 and probe pins 190 can be detected based on the first contact position.

Reference pad 150 further comprises a plurality of detection wirings 154 connected to respective sensing lines 152. Detection wiring 154 detects which of sensing lines 152 make contact with reference pin 192 in performing the electrical test. For example, in one example test, reference pin 192 and reference pad 150 are brought into contact with each other and an electrical test signal is applied to reference pin 192. Then, the electrical test signal passes through at least one of sensing lines 152 in contact with reference pin 192 and is detected by detection wiring 154. Therefore, detection wiring 154 detects the test signal from the at least one of sensing lines 152 and thus checks which of sensing lines 152 makes contact with reference pin 192. In addition, sensing lines 152 can be arranged at the blocks 102a through 102d of reference pad area 102 and thus the reference contact position of reference pin 192 relative to reference pad 150 can be detected by the positions of the detected signal lines 152.

In the embodiment of FIG. 2B, detection wiring 154 comprises a lower wiring below sensing line 152 and a contact plug interposed between the lower wiring and sensing lines 152. In some alternative embodiments, detection wiring 154 is coplanar with sensing lines 152 and is horizontally connected with sensing lines 152.

In some embodiments, each of detection wirings 154 is connected to a plurality of detection terminals (not shown), and the test signal passing through each signal line 152 is individually detected by a corresponding one of the corresponding detection terminals to check out which of sensing lines 152 transfers the test signal.

In a modified embodiment, at least two detection wirings 154 are commonly connected to a single detection terminal. An electrical resistive structure is respectively connected to each of the two detection wirings 154 and thus the test signal detected from each of the common detection wirings 154 is different from the other in accordance with their respective resistive structures. Therefore, the signal level detected by detection wirings 154 indicates which of signal lines 152 makes contact with reference pin 192. Thus, the bonding contact position and the alignment of reference pin 192 and reference pad 150 can be accurately detected or inspected by detection wirings 154.

Hereinafter, a method of inspecting the alignment or reference contact position of reference pin 192 and the reference pad 150 will be described in detail with reference to FIG. 4.

Figure 4:
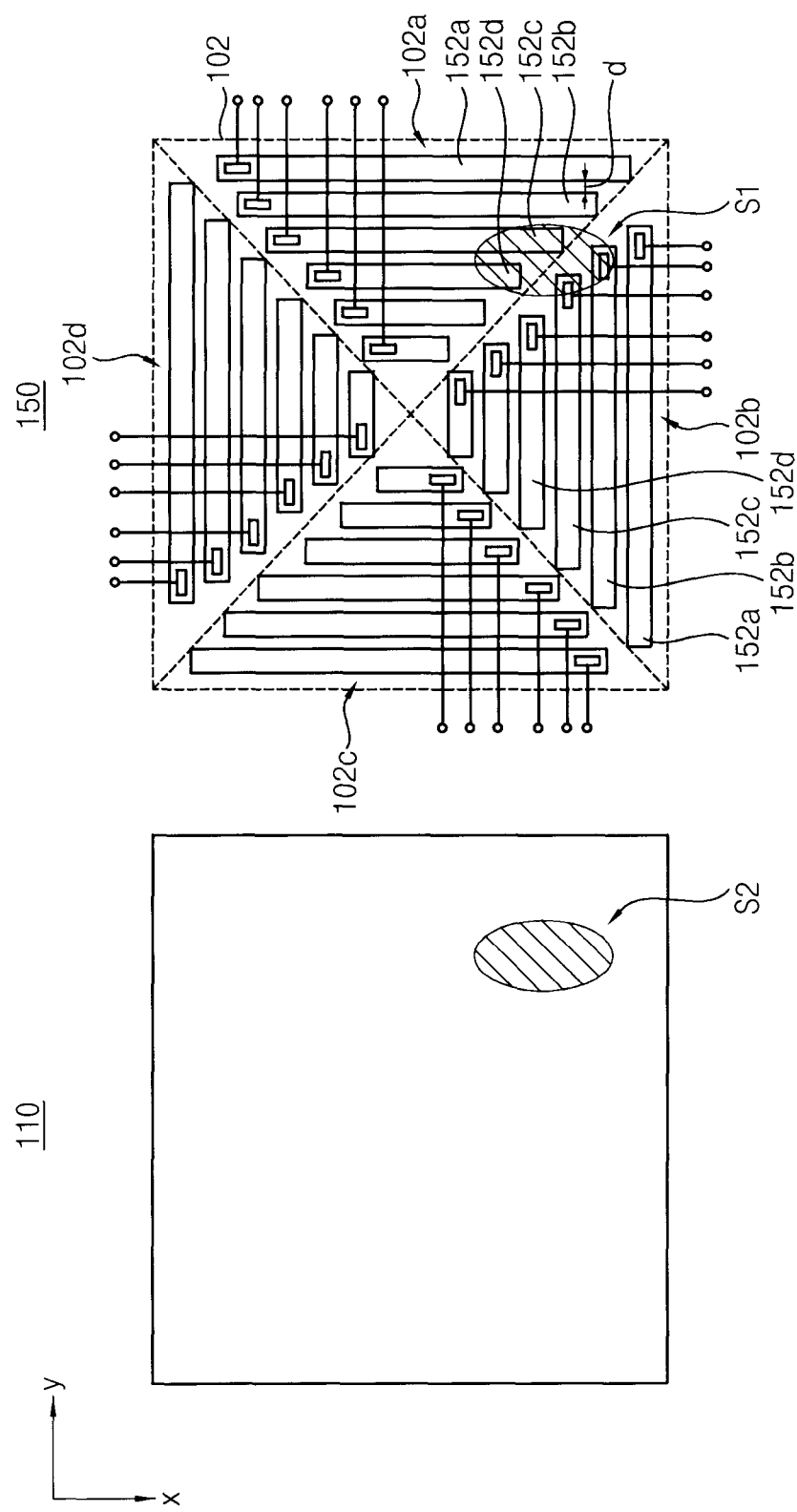
FIG. 4 is an enlarged plan view illustrating the bonding pad and the reference pad of the semiconductor device shown in FIG. 1.

FIG. 4 is an enlarged plan view illustrating one of bonding pads 110 and reference pad 150 of semiconductor device 100 shown in FIG. 1.

In FIG. 4, a first slash area S1 on reference pad 150 indicates a reference contact position of reference pin 192 and reference pad 150, and a second slash area S2 indicates the bonding contact position of a particular one of probe pins 190 and a corresponding one of bonding pads 110 in semiconductor device 110.

The probe pin 190 and reference pin 192 of the probe card are simultaneously brought into contact with the bonding pad 110 and reference pad 150 of semiconductor device 100 at first and second slash areas S1 and S2. Thus, the contact point of the probe pin 190 on the bonding pad 110 and the alignment failure of the probe pin 190 and the bonding pad 110 can be inspected based on the contact and alignment of reference pad 150 and reference pin 192.

Where reference pin 192 contacts a central portion of reference pad 150, probe pins 190 contact central portions of bonding pads 110 to form accurate alignment between probe pins 190 and bonding pads 110. In contrast, where reference pin 192 contacts an off-center portion of reference pad 150, probe pins 190 contact off-center portions of bonding pads 110 to form inaccurate alignment between probe pins 190 and bonding pads 110.

FIG. 4 shows an example of inaccurate alignment between probe pins 190 and bonding pads 110, since reference pin 192 makes contact with reference pad 150 at first slash area S1 spaced apart from the central portion thereof and first slash area S1 crosses first and second blocks 102a and 102b of reference pad area 102. In this example, reference pin 192 makes contact with sensing lines 152 at both of first and second blocks 102a and 102b and at least two sensing lines 152 make contact with reference pin 192 in the first block 102a or in second block 102b of reference pad area 102.

Where the electrical test signal is applied to reference pin 192, the test signal passes through the sensing lines 152 contacting reference pad 192 and is detected by detection wirings 154. Sensing lines 152a through 152d in different blocks of reference pad 150 are installed in such a configuration that the test signal is detected at different voltages in accordance with sensing lines 152a through 152d.

Accordingly, the detection of the test signals from signal lines 152 indicates the reference contact position and alignment state of reference pin 192 and reference pad 150. The array sequence of sensing lines 152 from which the test signal is detected through detection wiring 154 accurately indicates the reference contact position of reference pin 192 on reference pad 150 and how much reference pin 192 is offset from the central portion of reference pad 150. Accordingly, the contact point of the reference pin and the reference pad reveals both the reference contact position and the alignment state.

Where reference pin 192 fails to make contact with the central portion of reference pad 150, the alignment can be corrected using correction values based on the detected reference contact position and the alignment state of reference pin 192 and reference pad 150. In other words, reference pin 192 can be re-positioned in accordance with the detected reference contact position so that reference pin 192 is positioned at the central portion of reference pad 150. As a result, probe pins 190 can be re-positioned at central positions of bonding pads 110 in accordance with the re-positioning of reference pin 192 on reference pad 150.

Where reference pin 192 and reference pad 150 are aligned slightly off of the central portion of reference pad 150 as shown in FIG. 4, the test signal is detected simultaneously from the third and fourth sensing lines 152c and 152d of the first block 102a and from the third and fourth sensing lines 152c and 152d of second block 102b. Thus, the detected test signal indicates that reference pin 192 crosses first and second blocks 102a and 102b and is positioned away from the central portion of reference pad 150 as shown in FIG. 4. To correct the misalignment, reference pin 192 can be shifted toward the central portion of reference pad 150.

As indicated by the foregoing, where semiconductor device 100 having bonding pads 110 and reference pad 150 undergoes an electrical test using a probe card having probe pins 190 and reference pin 192, the reference contact position between reference pin 192 and reference pad 150 is detected using signal lines 152. The detected reference contact position can then be used to adjust the relative position of reference pin 192 and reference pad 150 if necessary.

Figure 5:
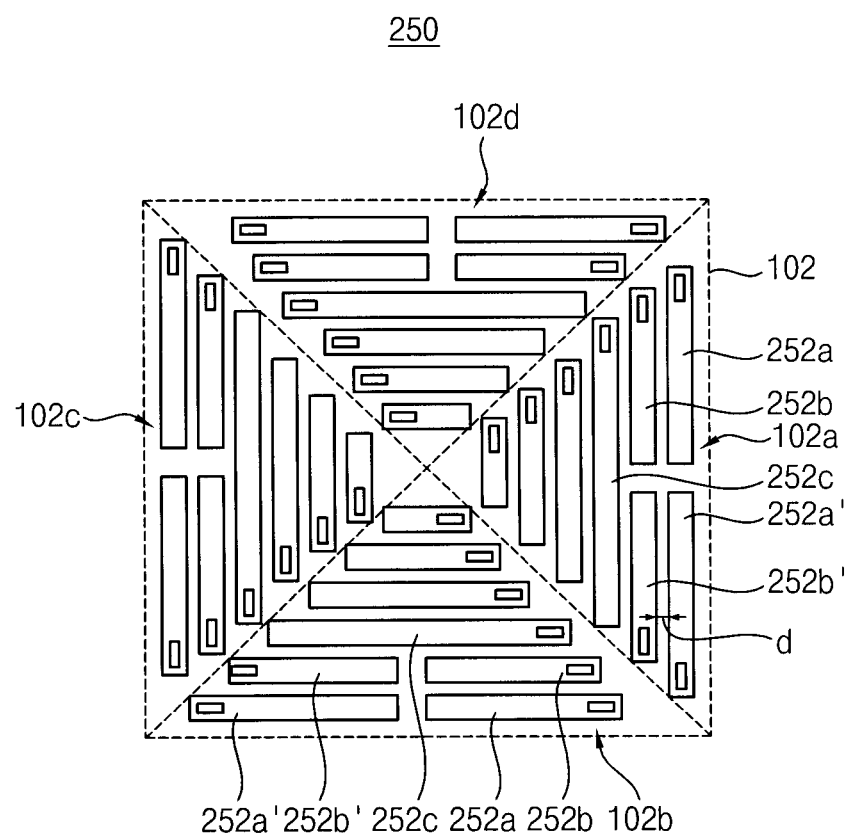
FIG. 5 is a plan view illustrating another embodiment of the reference pad in the semiconductor device of FIG. 1.

FIG. 5 is a plan view illustrating a reference pad 250 that can be used as an alternative to reference pad 150 in semiconductor device 100. Reference pad 250 is connected to other elements of semiconductor device 100 in a manner similar to reference pad 150. Also, reference pad 250 is arranged in a similar manner to reference pad 150.

Like reference pad 150, reference pad 250 is positioned adjacent to bonding pads 110 in a configuration where upper surfaces of reference pad 250 are coplanar with upper surfaces of bonding pads 110. Reference pad 250 comprises a plurality of signal lines 252 making contact with reference pin 192 of the probe card and detection wirings (not shown) for detecting a reference signal from signal lines 252.

Reference pad 250 is positioned in reference pad area 102 of substrate 101 and is formed with substantially the same outer dimensions as reference pad 150. Reference pad area 102 is formed with the same size and shape as bonding pads 110 so that bonding pads 110 are aligned with reference pad area 102. Consequently, different positions of reference pad 250 in reference pad area 102 correspond uniquely to different positions on bonding pad 110. Thus, where reference pad area 102 and bonding pads 110 are defined by the same coordinate system, the positions in reference pad area 102 and the corresponding positions on bonding pad 110 are designated with the same coordinate value. Probe pins 190 and reference pin 192 are controlled simultaneously with each other in the probe card, so the position of probe pins 190 on bonding pads 110 (hereinafter, "second contact position") can be controlled based on the position of reference pin 192 on reference pad 250 (hereinafter, "first contact position").

In the embodiment of FIG. 5, reference pad area 102 is separated into blocks 102a through 102d, and reference pad 250 comprises a plurality of sensing lines 252 arranged in each block of reference pad area 102.

Sensing lines 252 are formed of a conductive material, such as a conductive metal. In some embodiments, sensing line 252 is formed of substantially the same material as bonding pad 110. In addition, an upper surface of sensing line 252 is typically coplanar with an upper surface of bonding pad 110, and thus the first and second contact positions can be located substantially in the same plane. Sensing lines 252 are separated from each other by an insulation layer interposed between neighboring sensing lines 252.

In the embodiment of FIG. 5, some of sensing lines 252 near edge lines of reference pad area 102 are broken into pieces while other of sensing lines 252 near a central portion of reference pad area 102 remain unbroken in the same structure as sensing lines 152 shown in FIG. 2A. As examples, sensing lines 252 broken into two pieces comprise piece lines 252a, 252a', 252b and 252b' in a line parallel with the edge line, respectively. In contrast, unbroken sensing lines 252 include single lines 252c. By using the broken lines, the embodiment of FIG. 5 can detect the contact position of reference pin 192 more accurately than the embodiment of FIG. 4.

Sensing lines 252 are arranged in each block in parallel with corresponding edge lines of reference pad area 102. Sensing lines 252 are separated from each other in the blocks by a gap distance "d" that is smaller than a diameter of reference pin 192. Thus, where the electrical test process is performed on semiconductor device 100, reference pin 192 makes electrical contact with at least one of sensing lines 252 of reference pad 250 and the first contact position between reference pin 192 and reference pad 250 can be determined by detecting which of sensing lines 252 makes contact with reference pin 192. The bonding contact position of bonding pads 110 and probe pins 190 is then detected based on the first contact position.

In certain embodiments, reference pad 250 further comprises a plurality of detection wirings (not shown) connected to respective sensing lines 252. In certain embodiments, the detection wirings have the same structure and function as detection wirings 154 shown in FIG. 2B.

As indicated by the description of FIG. 5, the alignment status and contact position of bonding pads 110 and the probe pins 190 can be determined through the use of reference pad 250 in conjunction with probe pin 192.

Figure 6:
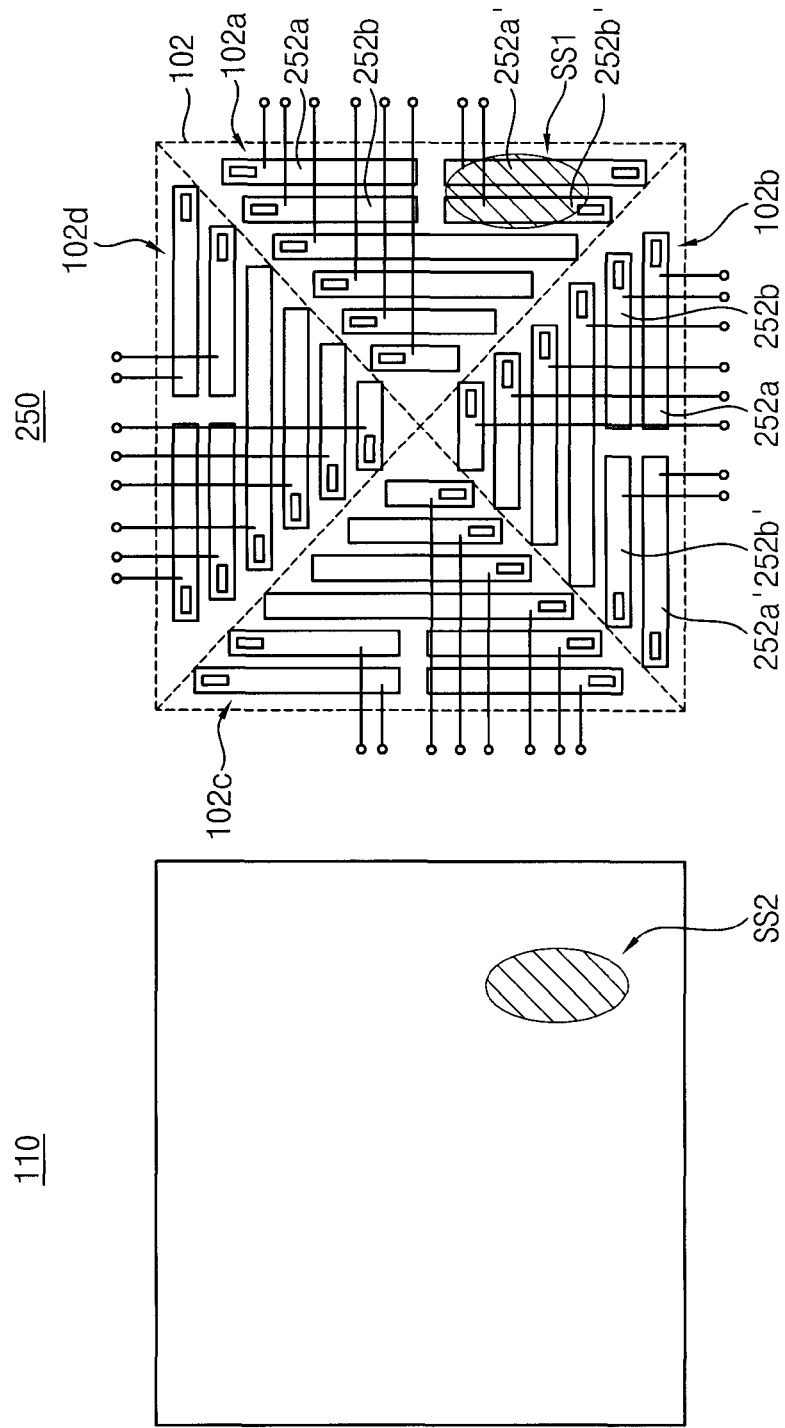
FIG. 6 is an enlarged plan view illustrating the reference pad of FIG. 5 and a bonding pad of the semiconductor device of FIG. 1.

FIG. 6 is an enlarged plan view illustrating reference pad 250 of FIG. 5 and one of bonding pads 110 of semiconductor device 100.

In FIG. 6, a first slash area SS1 indicates a reference contact position of reference pin 192 and reference pad 250 and a second slash area SS2 indicates the bonding contact position of one of probe pins 190 and a corresponding one of bonding pads 110 in semiconductor device 100.

The probe pin 190 and reference pin 192 of the probe card are simultaneously brought into contact with bonding pad 110 and reference pad 250 of semiconductor device 10 at the first and second slash areas SS1 and SS2. Thus, the contact point of the probe pin 190 on the bonding pad 110 and the alignment failure of the probe pin 190 and the bonding pad 110 can be identified based on the contact and alignment of reference pad 250 and reference pin 192.

Where reference pin 192 is brought into contact with reference pad 250 at a central portion thereof, probe pins 190 make contact with bonding pads 110 at central portions thereof, thereby forming good alignment of probe pin 190 and bonding pads 110. On the other hand, where reference pin 192 is brought into contact with reference pad 250 away from the central portion thereof probe pins 190 makes contact with bonding pads 110 positions away from the central portion, thereby forming bad alignment between probe pins 190 and bonding pads 110.

In the example of FIG. 6, reference pin 192 makes contact with reference pad 250 at first slash area SS1, which is located near, or adjacent to, the edge line of reference pad area 102. In first slash area SS1, sensing lines 252 are broken into piece lines 252a' and 252b' so that the location of reference pin 192 can be detected with greater accuracy than the embodiment of FIG. 4. Upon detection of first slash area SS1, reference pin 192 can be re-positioned to adjust the location of probe pins 190.

Where probe pins 190 and reference pin 192 may make contact with bonding pads 110 and reference pad 250 in slash areas SS1 and SS2 as shown in FIG. 6, the test signal is detected simultaneously from first and second piece lines 252a' and 252b' in first block 102a of reference pad area 102. The detected test signal indicates that probe pins 190 make contact with a boundary area of first and second piece lines 252a' and 252b' of reference pad 250 and probe pin 190 makes contact with bonding pad 110 at an off-centered location.

Reference pin 192 can be shifted based on the off-centered location to bring it into contact with the central portion of reference pad 250. This shifting of reference pin 192 causes probe pins 190 to shift to center portions of bonding pads 110, creating a favorable electrical connection for performing electrical tests.

As indicated by the above description of FIGS. 5 and 6, sensing lines can be broken into piece lines to increase the accuracy of methods used to detect the positions of a reference pin on a reference pad. The detected position of the reference pin on the reference pad can then be used to adjust the positions of probe pins on bonding pads.

Figure 7:
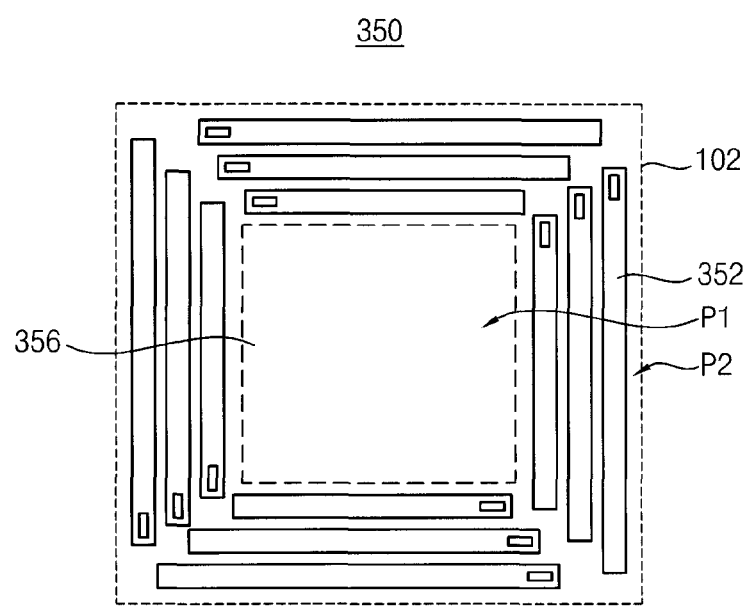
FIG. 7 is a plan view illustrating another embodiment of the reference pad in the semiconductor device of FIG. 1.

FIG. 7 is a plan view illustrating a reference pad 350 that can be used as an alternative to reference pad 150 in semiconductor device 100. Reference pad 350 is connected to other elements of semiconductor device 100 in a manner similar to reference pad 150. Also, reference pad 350 is arranged in a similar manner to reference pad 150.

Like reference pad 150, reference pad 350 is positioned adjacent to bonding pads 110 in a configuration where upper surfaces of reference pad 350 are coplanar with upper surfaces of bonding pads 110. Reference pad 350 comprises a plurality of signal lines 352 making contact with reference pin 192 of the probe card and detection wirings (not shown) for detecting a reference signal from signal lines 352.

Reference pad 350 is positioned in reference pad area 102 of substrate 101 and is formed with substantially the same outer dimensions as reference pad 350. Reference pad area 102 is formed with the same size and shape as bonding pads 110 so that bonding pads 110 are aligned with reference pad area 102. Consequently, different positions of reference pad 350 in reference pad area 102 correspond uniquely to different positions on bonding pad 110. Thus, where reference pad area 102 and bonding pads 110 are defined by the same coordinate system, the positions in reference pad area 102 and the corresponding positions on bonding pad 110 are designated with the same coordinate value. Probe pins 190 and reference pin 192 are controlled simultaneously with each other in the probe card, so the position of probe pins 190 on bonding pads 110 can be controlled based on the position of reference pin 192 on reference pad 350.

In the embodiment of FIG. 7, reference pad area 102 is separated into a first block P1 where reference pin 192 should be located for correct alignment with reference pad 350, and a second block P2 where reference pin 192 is incorrectly aligned with reference pad 350. In the embodiment of FIG. 7, reference pad area 102 is shaped as a rectangle and second block P2 is divided into four areas parallel with each edge line of the rectangular reference pad area 102.

Reference pad 350 comprises a plurality of sensing lines 352 arranged in second block P2 and an insulation pattern 356 covering first block P1. No detection wirings are connected to the insulation pattern in first block P1. Thus, no signals are transferred through insulation pattern 356 of reference pad 350 in first block P1. Consequently, where the reference pin is correctly aligned with reference pad 350, no reference signals are detected from reference pad 350.

A subset of sensing lines 352 are arranged in each area of second block P2 in parallel with the edge line of reference pad area 102. The sensing lines 352 in each area of second block P2 are separated from each other by a gap distance "d", and the lengths of sensing lines closer to first block P1 are shorter than those closer to the edges of reference pad area 102. In various alternative embodiments, sensing lines 352 can have the same structure and shape as sensing lines 152 of FIG. 2 or as sensing lines 252 of FIG. 5.

In some embodiments, reference pad 350 further comprises a plurality of detection wirings connected to sensing lines 352. The detection wirings can have the same structure and function as detection wirings 154 shown in FIG. 2B, and thus any further detailed descriptions on the detection wirings will be omitted.

In the embodiment of FIG. 7, where an electrical test signal is generated by the probe card while the reference pin is in proper contact with the reference pad at first block P1, no test signal is detected from reference pad 350 due to insulation pattern 356. This lack of signal indicates that the probe pins and the bonding pads of semiconductor device 100 are correctly aligned with each other. In contrast, where an electrical test signal is generated by the probe card while the reference pin is in contact with reference pad at second block P2, the test signal is detected from sensing lines 352. The detection of the test signal indicates that the probe pins and the bonding pads are misaligned with each other.

Where the probe pins are misaligned with the bonding pads, the reference contact position of the reference pin and reference pad 350 can be determined by verifying which of sensing lines 352 transfers the test signal. The reference pin can then be shifted to first block P1 of reference pad area 102 for correcting the misalignment based on the reference contact position. The shifting of the reference pin can be used to adjust probe pins into proper alignment with corresponding bonding pads.

Figure 8:
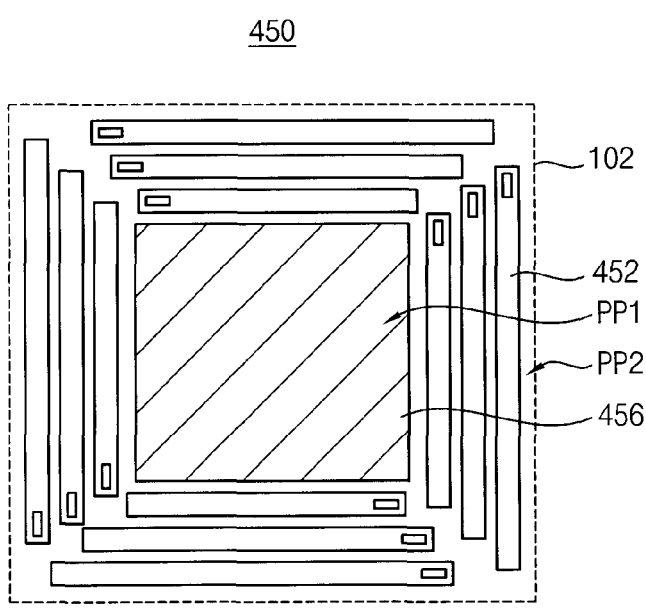
FIG. 8 is a plan view illustrating another embodiment of the reference pad in the semiconductor device of FIG. 1.

FIG. 8 is a plan view illustrating a reference pad 450 that can be used as an alternative to reference pad 150 in semiconductor device 100. Reference pad 450 is connected to other elements of semiconductor device 100 in a manner similar to reference pad 150. Also, reference pad 450 is arranged in a similar manner to reference pad 150.

Like reference pad 150, reference pad 450 is positioned adjacent to bonding pads 110 in a configuration where upper surfaces of reference pad 450 are coplanar with upper surfaces of bonding pads 110. Reference pad 450 comprises a plurality of signal lines 452 making contact with reference pin 192 of the probe card and detection wirings (not shown) for detecting a reference signal from signal lines 452.

Reference pad 450 is positioned in reference pad area 102 of substrate 101 and is formed with substantially the same outer dimensions as reference pad 450. Reference pad area 102 is formed with the same size and shape as bonding pads 110 so that bonding pads 110 are aligned with reference pad area 102. Consequently, different positions of reference pad 450 in reference pad area 102 correspond uniquely to different positions on bonding pad 110. Thus, where reference pad area 102 and bonding pads 110 are defined by the same coordinate system, the positions in reference pad area 102 and the corresponding positions on bonding pad 110 are designated with the same coordinate value. Probe pins 190 and reference pin 192 are controlled simultaneously with each other in the probe card, so the position of probe pins 190 on bonding pads 110 are controlled based on the position of reference pin 192 on reference pad 450.

In the embodiment of FIG. 8, reference pad area 102 is separated into a first block PP1 where reference pin 192 should be positioned for correct alignment with reference pad 450, and a second block PP2 where reference pin 192 is incorrectly aligned with reference pad 450. In this embodiment, reference pad area 102 is shaped in a rectangle and second block PP2 is divided into four areas parallel with each edge line of rectangular reference pad area 102.

Reference pad 450 comprises a plurality of sensing lines 452 arranged in second block PP2 and a conductive pattern 456 covering first block PP1. Conductive pattern 456 typically comprises the same conductive material as bonding pad 110, such as a conductive metal.

In different designs of reference pad 450, additional wiring (not shown) or no additional wiring can be connected to conductive pattern 456. Where reference pin 192 is in contact with reference pad 450 in first block PP1, the test signal or no test signal may be detected depending on whether the additional wiring is connected to conductive pattern 456.

A subset of sensing lines 452 is arranged in each area of second block PP2 in parallel with the edge line of reference pad area 102. Within each area of second block PP2, sensing lines 452 are separated from each other by a gap distance "d", and sensing lines located closer to first block PP1 are shorter than those connected closer to the edges of reference pad area 102. In various alternative embodiments, sensing lines 452 can have the same structure and shape as sensing lines 152 of FIG. 2 or sensing lines 252 of FIG. 5.

In some embodiments, reference pad 450 further comprises a plurality of detection wirings connected to sensing lines 452. The detection wiring typically have the same structure and function as detection wirings 154 shown in FIG. 2B, and thus further detailed descriptions on the detection wirings will be omitted to avoid redundancy.

In the embodiment of FIG. 8, where an electrical test signal is generated by a probe card having a reference pin in proper contact with the reference pad at first block PP1, a test signal is detected from reference pad 450 due to conductive pattern 456. The detection of the test signal through conductive patterns 456 indicates that the probe pins and the bonding pads are properly aligned with each other. In contrast, where an electrical test signal is applied to the probe card having the reference pin in contact with the reference pad at the second block PP2, the test signal is detected from sensing lines 452. The detection of the test signal through sensing lines 452 indicates that the probe pins and the bonding pads are misaligned with each other.

Where the probe pins are misaligned with the bonding pads, the reference contact position of the reference pin and reference pad 450 is detected by verifying which of sensing lines 452 transfers the test signal. Thus, reference pin 192 can be shifted to first block PP1 to correct the misalignment based on the reference contact position. The probe pins are shifted with the shifting of the reference pin to correctly align the probe pins and bonding pads.

FIG. 9 is a flowchart illustrating a method of performing an electrical test in a semiconductor device such as those illustrated in FIGS. 1-8. In the description of FIG. 9, example method steps are indicated by parentheses.

In the method of FIG. 9, semiconductor device 100 is brought into contact with a test apparatus comprising a plurality of probe pins and a reference pin (905). The probe pins make contact with respective bonding pads 110 and the reference pin makes contact with a reference pad such as reference pad 150, 250, 350 or 450. Thereafter, a test signal is applied to the reference pin to detect the alignment between the reference pin and the reference pad (910). Then, the test signal is detected from a portion of sensing lines making contact with the reference pin to determine a reference contact position between the reference pin and the reference pad (915). Finally, the alignment state of the probe pins and the bonding pads is determined based on the reference contact position (920). For instance, where the reference contact position is in a peripheral portion of the reference pad, the probe pins and the bonding pads may be determined to be misaligned.

Where the probe pins and bonding pads are determined to be misaligned, the reference pin is typically shifted to correct the alignment. For instance, the reference pin can be shifted to a central portion of the reference pad to shift the probe pins to respective central portions of the bonding pads.

In some embodiments, the alignment state of the probe pins is determined by detecting whether the reference contact position is in a first block in a central portion of the reference pad, or in a second block surrounding the first block. Upon determining that the reference contact position is in the second block, the alignment state is typically determined to be misaligned. In other words, the probe pins are deemed to be misaligned with the bonding pads.

After the probe pins and bonding pads are properly aligned, an electrical test, such as an electric die sorting process, can be performed by applying test signals to the semiconductor memory device through the probe pins and the bond pads.

As indicated by the foregoing, certain embodiments of the inventive concept allow accurate monitoring of the positions of probe pins on bonding pads through the use of a reference pin and various types of reference pads. The different reference pads allow accurate measurements of the location of the reference pin. The location of the reference pin can be adjusted until it is properly aligned with the reference pad, which results in accurate alignment between the probe pins and the bonding pads.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims.

What is claimed is:

1. A semiconductor device comprising:
a substrate;
a plurality of bonding pads formed on the substrate, wherein the bonding pads are configured to make contact with a plurality of probe pins of a test apparatus to receive electrical test signals for an electrical test of the semiconductor device;
a reference pad comprising a plurality of sensing lines located in a reference pad area of the substrate, wherein the reference pad is configured to make contact with a reference pin of the test apparatus, and the reference pad area has substantially the same shape and size as the bonding pads such that positions in the reference pad area correspond one-to-one with positions in each of the bonding pads; and
a plurality of detection wirings electrically connected to the respective sensing lines.

2. The semiconductor device of claim 1, wherein the reference pad area is divided into a plurality of blocks each corresponding to an edge of the reference pad area, and wherein a subset of the sensing lines is arranged in each of the blocks in parallel with the corresponding edge.

3. The semiconductor device of claim 1, wherein the plurality of sensing lines are formed of metal.

4. The semiconductor device of claim 2, wherein the parallel sensing lines in each block are separated from each other by a gap distance that is smaller than a diameter of the reference pin.

5. The semiconductor device of claim 2, wherein the reference pad area has a rectangular shape.

6. The semiconductor device of claim 5, wherein the reference pad area is divided into four triangular blocks each delimited by a pair of diagonal lines extending from a central point of the reference pad area to respective corners of the corresponding edge.

7. The semiconductor device of claim 6, wherein sensing lines adjacent to the edges of the reference pad area are divided into piece lines and sensing lines adjacent to the central point of the reference pad area are undivided.

8. The semiconductor device of claim 5, wherein the reference pad area is divided into a first block at a center portion of the reference pad area and a second block surrounding the first block.

9. The semiconductor device of claim 8, wherein the second block comprises four regions in which sensing lines are arranged in parallel with a corresponding edge of the reference pad area.

10. The semiconductor device of claim 8, wherein the first block corresponds to an aligned position of the reference position, and the second block corresponds to a misaligned position of the reference pin.

11. The semiconductor device of claim 8, wherein the reference pad further comprises an insulation pattern or a conductive pattern covering the first block of the reference pad area.

12. The semiconductor device of claim 1, further comprising a dynamic random access memory or a flash memory device formed on the substrate and electrically connected to the bonding pads.

13. A semiconductor device, comprising:
a substrate having opposite major surfaces;
a plurality of spaced-apart bonding pads of electrically conductive material disposed on one of the major surfaces, wherein adjacent bonding pads are spaced from each other by respective first intervals; and
a reference pad disposed on said one of the major surfaces of the substrate along with the bonding pads, the reference pad comprising at least one set of sensing lines constituted by a plurality of line segments of electrically conductive material extending parallel to one another in a plane parallel to said major surface, wherein adjacent sensing lines in the set thereof are spaced from one another by second intervals each of which is shorter than each of the first intervals.

14. The semiconductor device of claim 13, further comprising a dynamic random access memory or a flash memory device integral with the substrate and electrically connected to the bonding pads.

15. The semiconductor device of claim 13, wherein the substrate is rectangular, respective ones of the bonding pads are disposed along each of the four sides of the substrate, the reference pad is confined to a rectangular reference pad area on said major surface of the substrate, the reference pad comprises four sub-sets of the sensing lines, the four sub-sets of the sensing lines are confined within four regions of the reference pad area, respectively, the four regions are delimited by the four sides of the rectangular pad area and four diagonal lines each extending from a central point of the reference pad area to a location where respective ends of the four sides of the pad area meet, and the line segments within each region of the reference pad area extend parallel to the side of the reference pad area that delimits the region with two of the diagonal lines.

16. A semiconductor device, comprising:
a substrate having a rectangular surface corresponding to respective sides of the device;
a plurality of spaced-apart bonding pads of electrically conductive material disposed on an outer peripheral portion of said surface of the substrate; and
a reference pad disposed on said surface of the substrate along with the bonding pads, and
wherein the reference pad is confined to a reference pad area spaced from each of the bonding pads,
the reference pad comprises at least one sub-set of sensing lines constituted by a plurality of spaced-apart line segments of electrically conductive material extending lengthwise in a plane parallel said major surface and parallel to one another and to a respective side of the device.

17. The semiconductor device of claim 16, wherein the reference pad area is located on the outer peripheral portion of said surface of the substrate along with the bonding pads.

18. The semiconductor device of claim 17, wherein respective ones of the bonding pads are disposed along each of four sides of the device, the reference pad comprises four sub-sets of the sensing lines, the four sub-sets of the sensing lines are confined within four regions of the reference pad area, respectively, the line segments constituting the four sub-sets of the sensing lines extend parallel to the four sides of the device, respectively.

19. The semiconductor device of claim 18, wherein the reference pad further comprises a geometric pattern of electrical insulating material or electrically conductive material at a central portion of the reference pad area, and the four sub-sets of the sensing lines surround the geometric pattern.

20. The semiconductor device of claim 19, further comprising a dynamic random access memory or a flash memory device integral with the substrate and electrically connected to the bonding pads.

* * * * *